US011869946B2

(12) United States Patent
Teo et al.

(10) Patent No.: US 11,869,946 B2
(45) Date of Patent: Jan. 9, 2024

(54) ETCH-LESS ALGAN GAN TRIGATE TRANSISTOR

(71) Applicant: Mitsubishi Electric Research Laboratories, Inc., Cambridge, MA (US)

(72) Inventors: Kon Hoo Teo, Lexington, MA (US); Nadim Chowdhury, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 399 days.

(21) Appl. No.: 16/830,317

(22) Filed: Mar. 26, 2020

(65) Prior Publication Data

US 2021/0305373 A1  Sep. 30, 2021

(51) Int. Cl.
| | |
|---|---|
| *H01L 29/00* | (2006.01) |
| *H01L 29/20* | (2006.01) |
| *H01L 21/02* | (2006.01) |
| *H01L 21/04* | (2006.01) |
| *H01L 29/06* | (2006.01) |
| *H01L 29/778* | (2006.01) |
| *H01L 29/10* | (2006.01) |

(52) U.S. Cl.
CPC .... *H01L 29/2003* (2013.01); *H01L 21/02304* (2013.01); *H01L 21/0415* (2013.01); *H01L 29/0615* (2013.01); *H01L 29/1066* (2013.01); *H01L 29/7783* (2013.01); *H01L 29/7787* (2013.01)

(58) Field of Classification Search
CPC ........................ H01L 29/7783; H01L 29/2003
See application file for complete search history.

(56) References Cited

U.S. PATENT DOCUMENTS

| | | | |
|---|---|---|---|
| 2008/0211567 A1* | 9/2008 | Morita | H03K 17/74 327/425 |
| 2012/0025206 A1* | 2/2012 | Nakata | H01L 21/02378 257/77 |
| 2014/0094223 A1* | 4/2014 | Dasgupta | H01L 23/535 455/566 |

FOREIGN PATENT DOCUMENTS

| | | | | |
|---|---|---|---|---|
| FR | 3078198 A1 * | 8/2019 | ......... | H01L 29/0619 |
| WO | WO-2019089727 A1 * | 5/2019 | ......... | H01L 29/0657 |

OTHER PUBLICATIONS

Parish, Giancita, "Growth and Characterization of Aluminum Gallium Nitride/Gallium Nitride Ultraviolet Detectors", Mar. 2001. University of California Santa Barbara, PhD dissertation. https://my.ece.ucsb.edu/Mishra/resgroupfiles/parish.pdf (Year: 2001).*

(Continued)

*Primary Examiner* — Reema Patel
(74) *Attorney, Agent, or Firm* — Gennadiy Vinokur; Hironori Tsukamoto

(57) ABSTRACT

Devices and methods of a field effect transistor device that include a source, a gate and a drain. The transistor includes a semiconductor region position is under the source, the gate and the drain. Such that the semiconductor region can include a gallium nitride (GaN) layer and an III Nitride (III-N) layer. Wherein the GaN layer includes a band gap, and the III-N layer includes a band gap. Such that the III-N layer band gap is higher than the GaN layer band gap. A sub-region of the semiconductor region is located underneath the gate and is doped with Mg ions at selective locations in the sub-region.

18 Claims, 7 Drawing Sheets

(56) References Cited

OTHER PUBLICATIONS

Supryadkina et al., "Ab initio study of macroscopic polarization of AlN, GaN and AlGaN", Phys. Status Solidi C, 1-5, Jan. 2014. (Year: 2014).*

Hu et al., "Channel Engineering of Normally-Off AlGaN/GaN MOS-HEMTs by Atomic Layer Etching and High-K Dielectric", IEEE Electron Device Letters, vol. 39, No. 9, Sep. 2018. (Year: 2018).*

Britannica, The Editors of Encyclopedia. "nitrate". Encyclopedia Britannica, Dec. 28, 2022, https://www.britannica.com/science/nitrate. Accessed Mar. 29, 2023. (Year: 2023).*

\* cited by examiner

ETCH-LESS ALGAN GAN TRIGATE TRANSISTOR

FIELD

The present disclosure relates generally to semiconductor devices, and particularly to transistors incorporating an etch-less process.

BACKGROUND

In view of today's advancing technology systems improvements in power transistors are needed in order to provide more robust energy delivery networks and approaches to high-efficiency electricity generation and conversion. Conventional power transistor applications can include power supplies, electronic applications for many technology industries, such as high voltage direct current (HVDC) electronics, lamp ballasts, telecommunications circuits and display drives. These types of technological systems rely on efficient converters to step-up or step-down electric voltages, and use power transistors capable of blocking large voltages and/or carrying large currents.

Conventional power transistors used in such applications are made of silicon. However, the limited critical electric field of silicon and its relatively high resistance causes available commercial devices, circuits and systems to be very large and heavy, and operate at low frequencies. Therefore, such commercial devices are unsuitable for future generations of many different types of applications.

For example, conventional power semiconductor devices require many characteristics, that is, high breakdown voltage and low ON resistance. There exists a trade-off relationship determined by device material between breakdown voltage and ON resistance in the power semiconductor device. Wherein a low ON resistance close to limitations of a principal device material, such as silicon, can be realized in the power semiconductor device. Some conventional power semiconductor devices using a wide band gap semiconductor have experienced designs that have not been made in view of taking into consideration of the characteristics particular to the power device, that is, avalanche withstand capability into consideration. This is because GaN-based device is designed based on radio frequency (RF) device.

Therefore, in view of the aforementioned practicalities and difficulties, there is an unsolved need for devices and circuits that enhance the performance of Group III-Nitride semiconductor structures.

SUMMARY

The present disclosure relates generally to semiconductor devices, and particularly to transistors incorporating an etch-less process.

Some embodiments relate generally to device structures and fabrication methods to build electronics including transistor devices such as field effect transistor. The field effect transistor can include a source, a gate and a drain. The transistor has a semiconductor region positioned under the source, the gate and the drain. Such that the semiconductor region can include a first semiconductor layer and a second semiconductor layer. Wherein first semiconductor layer is a gallium nitride (GaN) material and includes a band gap, and the second semiconductor layer is III-Nitride (III-N) material and includes a band gap. Such that the second semiconductor band gap is higher than the first semiconductor layer band gap. A sub-region of the semiconductor region is located underneath the gate and is doped with Mg ions at selective locations in the sub-region.

During experimentation, high electron mobility transistors (HEMTs) based on AlGaN/GaN heterostructures were tested, and found to present excellent candidates for high-power, high-voltage and high-temperature applications. Performance of depletion-mode (D-mode) HEMTs tested appeared to be good, which appeared to be positive for digital IC applications and also for radio-frequency integrated circuit (RFIC) or Monolithic microwave integrated circuit (MMIC) designs, along with enhancement-mode (E-mode) devices test that also appeared could play a more important role in the future. For digital IC applications tested, the circuit configurations could be achieved by using direct-coupled FET logic (DCFL) which features integration of D-mode and E-mode HEMTs.

At the same time, for largescale IC designs, E-mode devices were tested which do not need a negative voltage supply were believed to greatly reduce the circuit design complexity. Further testing of enhancement-mode devices based on the AlGaN/GaN material system was done. Such that enhancement-mode devices based on an AlGaN/GaN material system and E-mode GaN HEMTs, including trigate (FinFET) devices were also tested.

Some realizations of the present disclosure obtained from experimentation included testing with E-mode AlGaN GaN HEMT, in particular, in Trigate (FinFET). Wherein, a threshold voltage for the Trigate (FinFET) was found to lie between 0.2-1.5 V depending on a fin-width. Learned was that having a narrow fin width can provide more E-mode behavior and vice versa. However, what was later realized is that the narrow fin width reduces an on current of the transistor device, along with another reason which was due to a lack of an active channel area. Also learned is that fins fabricated by selectively etching the AlGaN GaN can have negative effects. For example, because of this etched trigate transistor there were reliability concerns because of dangling bonds formed during the etching process. One of the many challenges to overcome for aspects of the present disclosure was figuring out a solution to these problems. In facing ways to overcome these challenges, one realization included exploring possible fabricating approaches for a trigate device without etching.

Some problems with etching discovered from experimentation was a number of dangling bonds on an (Al)GaN surface appeared to induce surface-depleted band bending as a result of a surface pinning effect. For example, a lateral channel surface can show depleted areas from the sidewall gates in the trigate structure. A dangling bond is an unsatisfied valence on an immobilized atom. An atom with a dangling bond is also referred to as an immobilized free radical or an immobilized radical, a reference to its structural and chemical similarity to a free radical. Some other experiments tested included etching the p-GaN outside the gate region using dry etching while maintaining a completeness of a thickness of the underlying epitaxial layer. However, what was later learned that if the underlying epitaxial layer is etched too much, the two-dimensional electron gas (2DEG) will not be formed at the interface of AlGaN/GaN of an N-face p-GaN gate E-mode HEMT structure. Which meant that using dry etching can be challenging because the etching depth was hard to control and nonuniformity in thickness still occurred in every epitaxial layer of an epitaxial wafer. Also, this epitaxial structure had problems related to current collapse, such as buffer traps and surface traps, requiring further resolution.

Thus, based upon what was learned from experimentation, testing of the effects of etching were not furthered. Wherein further experimentation lead to fabricating a trigate device without etching. At least one main difference between an AlGaN GaN HEMT device and the transistor device of the present disclosure is the gate region. In the transistor device of the present disclosure, the region underneath the gate is selectively Mg ion implanted, and then annealed. Such that the Mg implantation converts the AlGaN and GaN to p-AlGaN and p-GaN, respectively, and generates holes in the implanted region. These implanted regions deplete the 2-DEG and provides E-mode operation for the device. Some features and characteristics of the transistor device of the present disclosure, by non-limiting example, include:

(a) Threshold voltage higher than the trigate AlGaN GaN HEMT;
(b) Better gate control compared to gate injection transistor;
(c) Higher breakdown voltage because of the super junction; and
(d) Higher reliability because of etchless process.

Practical Applications

Applications for the transistor devices of the present disclosure can be used with many technologies, including by-non-limiting example: microwaves, millimeter wave communications, imaging, radar, and radio astronomy, etc. In fact, any application where high gain and low noise at high frequencies can be required. Other applications for the transistor devices of the present disclosure can be in many types of equipment ranging from cellphones and DBS receivers to electronic systems such as radar and for radio astronomy. Other applications for the transistor devices of the present disclosure can be used as power switching transistors for voltage converter applications.

Transistors of the present disclosure provide unique characteristics as noted above, which are key for active components in practically all modern electronics. The transistors of the present disclosure can be produced in integrated circuits (IC) and microchips, along with diodes, resistors, capacitors and other electronic components, to produce complete electronic circuits. The transistors of the present disclosure can be manufactured at a low cost (when compared to conventional transistors), and are reliable which is an attribute highly have made it a ubiquitous device. Transistorized mechatronic circuits have replaced electromechanical devices in controlling appliances and machinery. It is often easier and cheaper to use a standard microcontroller and write a computer program to carry out a control function than to design an equivalent mechanical system to control that same function.

According to an embodiment of the present disclosure, a field effect transistor, including a source, a gate and a drain. A semiconductor region is under the source, the gate and the drain. Such that the semiconductor region includes a gallium nitride (GaN) layer and a three nitride (III-N) layer. Wherein GaN layer includes a band gap and the III-N layer includes a band gap, such that the III-N layer band gap is higher than the GaN layer band gap. A sub-region of the semiconductor region underneath the gate is doped with Mg ions at selective locations in the sub-region.

According to another embodiment of the present disclosure, a transistor including a source, a gate and a drain. A semiconductor region is under the source, the gate and the drain. Such that the semiconductor region includes a gallium nitride (GaN) layer and a three nitride (III-N) layer. Wherein GaN layer includes a band gap and the III-N layer includes a band gap, such that the III-N layer band gap is higher than the GaN layer band gap. Wherein the GaN layer and the III-N layer are undoped. A sub-region of the semiconductor region underneath the gate is doped with Mg ions at selective locations in the sub-region.

According to another embodiment of the present disclosure, a transistor including a source, a gate and a drain. A semiconductor region is under the source, the gate and the drain. Such that the semiconductor region includes a gallium nitride (GaN) layer and a three nitride (III-N) layer. Wherein GaN layer includes a band gap and the III-N layer includes a band gap, such that the III-N layer band gap is higher than the GaN layer band gap. Wherein the III-N layer has a higher spontaneous polarization charge than a spontaneous polarization charge of the GaN layer. A sub-region of the semiconductor region underneath the gate is doped with Mg ions at selective locations in the sub-region.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art, which fall within the scope and spirit of the principles of the presently disclosed embodiments.

DETAILED DESCRIPTION

The present disclosure relates generally to semiconductor devices, and particularly to transistors incorporating an etch-less process.

Figure 1A:
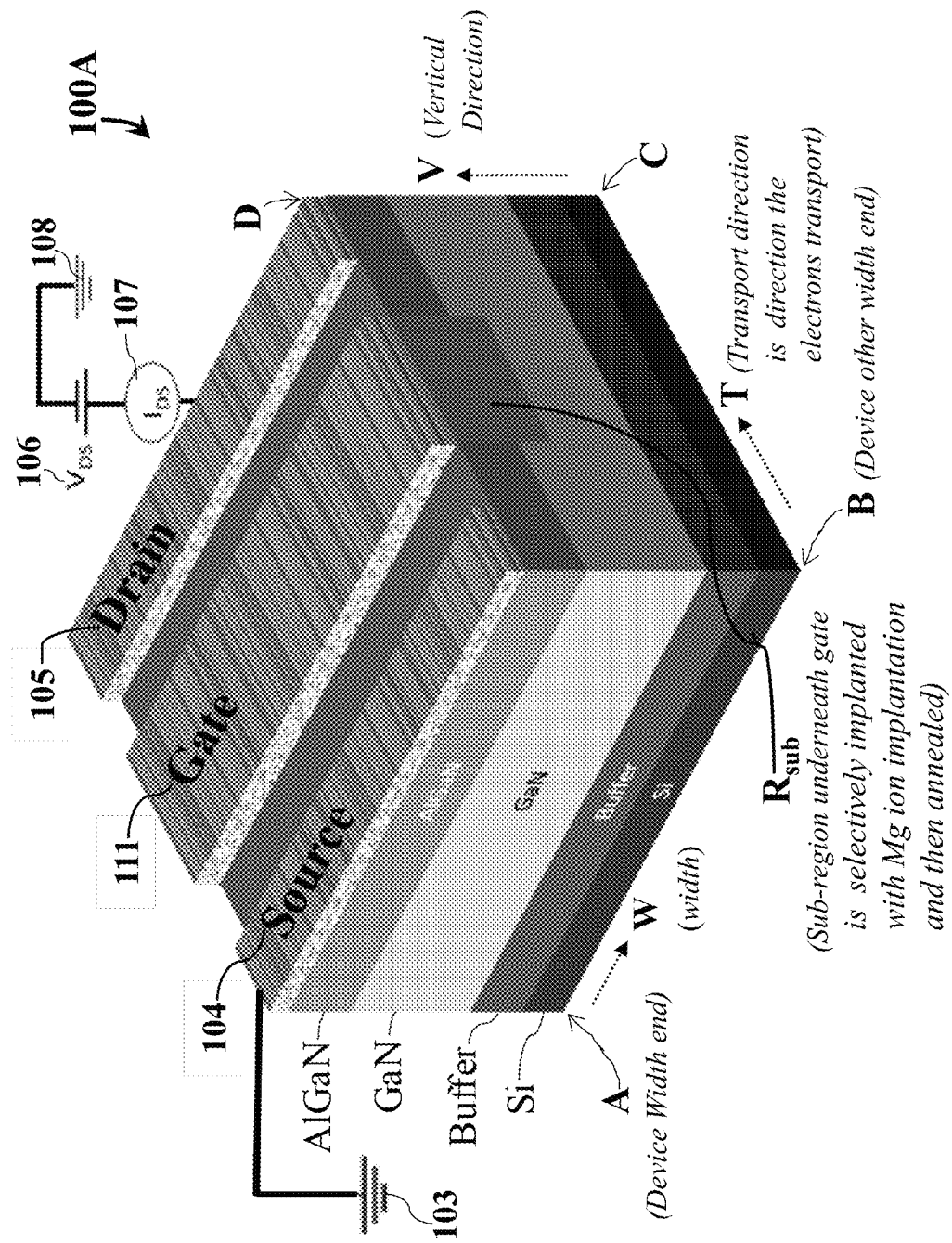
FIG. 1A is a schematic illustrating a three-dimensional (3D) view of a transistor device, according to an embodiment of the present disclosure.

FIG. 1A is a schematic illustrating a three-dimensional (3D) view of a transistor device, according to an embodiment of the present disclosure. For example, FIG. 1A shows a field effect transistor 100A, including a source 104, a gate 111 and a drain 105. A semiconductor region is under the source 104, the gate 111 and the drain 105, and includes a base layer, a buffer layer over the base layer. A gallium nitride (GaN) layer is over the buffer layer, and a three nitride (III-N) layer over the GaN layer. A vertical thickness of the GaN layer is greater than a vertical thickness of the III-N layer. For example, the vertical thickness of the GaN layer can be 10× times thicker than the vertical thickness of the III-N layer, or the vertical thickness of the GaN layer can be 1000% percent thicker than the vertical thickness of the III-N layer. A sub-region $R_{sub}$ of the semiconductor region underneath the gate 111 is doped with Mg ions (see FIGS. 2A-2D) at selective locations 113 in the sub-region $R_{sub}$.

Contemplated is that a gap distance between the source 104 and the gate 111, and a gap distance between the gate 111 and the drain 105, can be one of symmetrical or non-symmetrical. Wherein the gap distance between the gate and the drain correlates to a breakdown voltage of the field effect transistor.

Further, the III-N layer can be aluminum gallium nitride (AlGaN). It is also possible that the III-N layer can be an AlxInyGa1-x-yN, such that a value of x and y is between 0 and 1 (0≤x≤1), (0≤y≤1). Wherein the III-N layer has a higher spontaneous polarization charge than a spontaneous polarization charge of the GaN layer. Wherein the GaN layer includes a band gap and the III-N layer includes a band gap, such that the III-N layer band gap is higher than the GaN layer band gap.

Still referring to FIG. 1A, a first end of a device width A, extends to another device width end B, and represents a width direction W. Further, from the another device width end B to a location C, represents the transport direction of the electron flow. Also, from location C to location D, represents a device vertical direction V. The source 103 includes a ground 103, and the drain 105 has an applied voltage between the source 104 and the drain 105 of the device 100A to read the state of the device 100A connected to a ground 108. $V_{DS}$ 106 is the read voltage and can be positive or negative relative to the ground 108. $I_{DS}$ 107 is the source-to-drain current coining out from the device 100A. $I_{DS}$ 107 is a resistance state of the device 100A. It can be either a high resistance state or a low resistance state, depending on the polarity of the applied voltage.

Figures 1B, 1C, 1D:
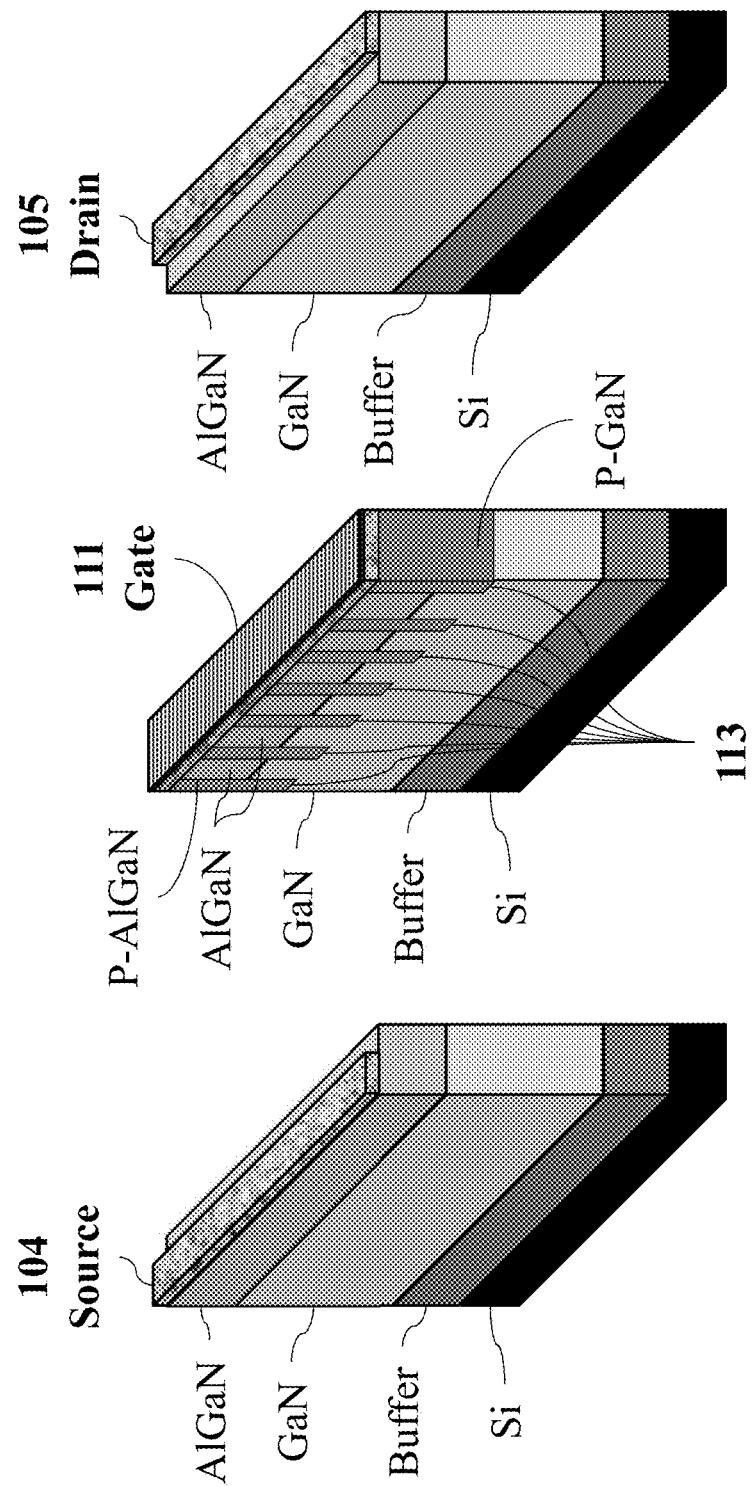
FIG. 1B, FIG. 1C and FIG. 1D are schematics illustrating a cross-sectional view of FIG. 1A, showing the structure and thicknesses of the gate stack, along with other structure and thicknesses of the transistor device, according to some embodiments of the present disclosure.

FIG. 1B, FIG. 1C and FIG. 1D are schematics illustrating a cross-sectional view of FIG. 1A, showing the structure and thickness of the gate 111 stack, along with other structure and thicknesses of the source 104 stack and the drain 105 stack of the field transistor device, according to some embodiments of the present disclosure. FIG. 1B shows the source 104 arranged over a portion of the III-N layer (or AlGaN layer), and FIG. 1D shows the drain 105 located over a portion of the III-N layer (or AlGaN layer). FIG. 1C shows the gate 11 position over the entire III-N layer (or AlGaN layer), such that the selective Mg implantation locations 113 converts the AlGaN to p-AlGaN and GaN to p-GaN, respectively, and generates holes in the implanted region.

Figure 2A:
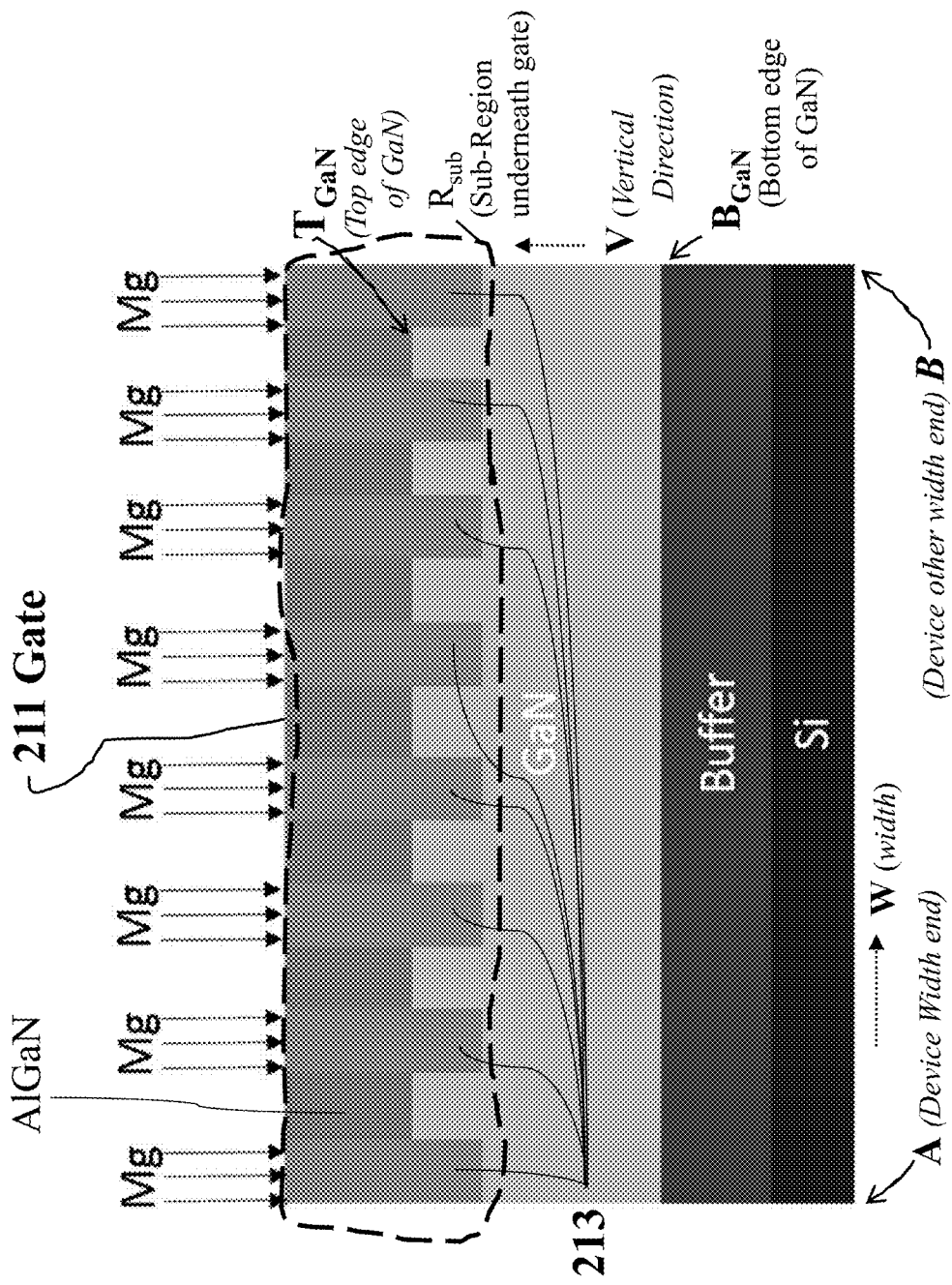
FIG. 2A is a schematic illustrating a cross section of the transistor device of FIG. 1A, underneath the gate region, showing the Mg implanted region, according to some embodiments of the present disclosure.

FIG. 2A is a schematic illustrating a cross section of the transistor device of FIG. 1A, underneath the gate region at the location of a sub-region $R_{sub}$, showing the selected locations 213 of Mg implantation, according to some embodiments of the present disclosure. For example, FIG. 2A shows a bottom edge $B_{GaN}$ of the GaN layer and a top edge $T_{GaN}$ of the GaN layer. The sub-region $R_{sub}$ underneath the gate 211, at selected locations 213 is implanted with Mg, and then annealed. Such that the Mg implantation converts the AlGaN and GaN to p-AlGaN and p-GaN, respectively, and generates holes in the implanted region. These implanted regions deplete the 2-DEG and provides E-mode operation for the device. The depth of each selected location of the Mg implantation can extend across the top edge TGaN of the GaN and into the GaN layer. Contemplated is that each selected location of the Mg implantation can extend about 10% into the GaN layer.

Figure 2B:
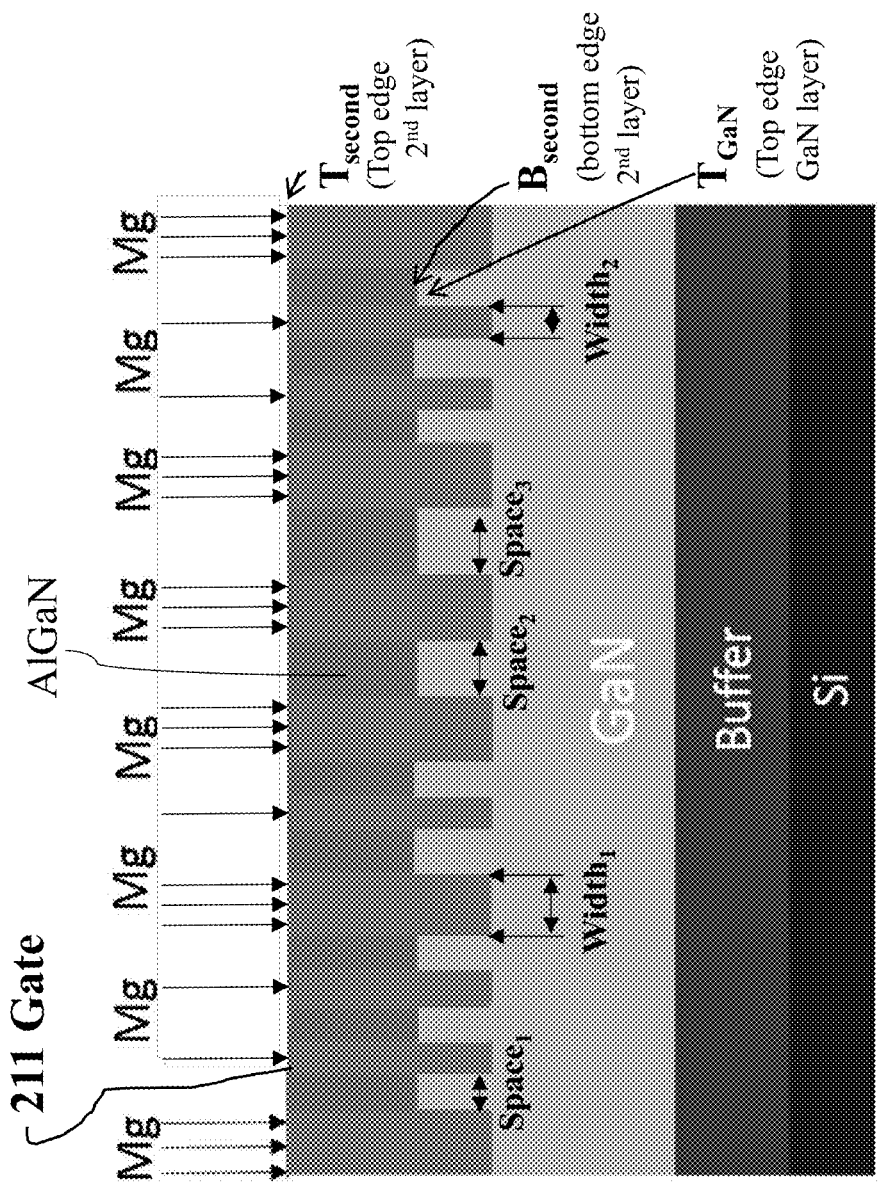
FIG. 2B is a schematic illustrating another cross section of the gate of the transistor device of FIG. 2A, underneath the gate region at the location of a sub-region, showing that selected locations of Mg implantation having varied spacing between the selected locations along with varied widths along a width direction from A location to B location (see FIG. 1A), according to some embodiments of the present disclosure.

FIG. 2B is a schematic illustrating another cross section of the gate of the transistor device of FIG. 1A, underneath the gate region at the location of a sub-region $R_{sub}$, showing that selected locations 213 of Mg implantation having varied spacing between the selected locations 213 along with varied widths along a width direction from A location to B location (see FIG. 1A), according to some embodiments of the present disclosure. For example, FIG. 2B shows a top edge $T_{second}$ of the III-N layer (second layer over the GaN layer), and a bottom edge $B_{second}$, wherein the second layer (III-N layer) can be aluminum gallium nitride (AlGaN). wherein, each selected location doped with Mg ions in the sub-region can have a depth extending from the top edge $T_{second}$ of the III-N layer across an interface of a bottom edge $B_{second}$ of the III-N layer into a top edge $T_{GaN}$ of the GaN layer. Contemplated is that the spacing of the selected Mg implanted locations can be symmetrical or non-symmetrical. It is possible that the widths of the selected Mg implanted locations can be symmetrical or non-symmetrical.

Figure 2C:
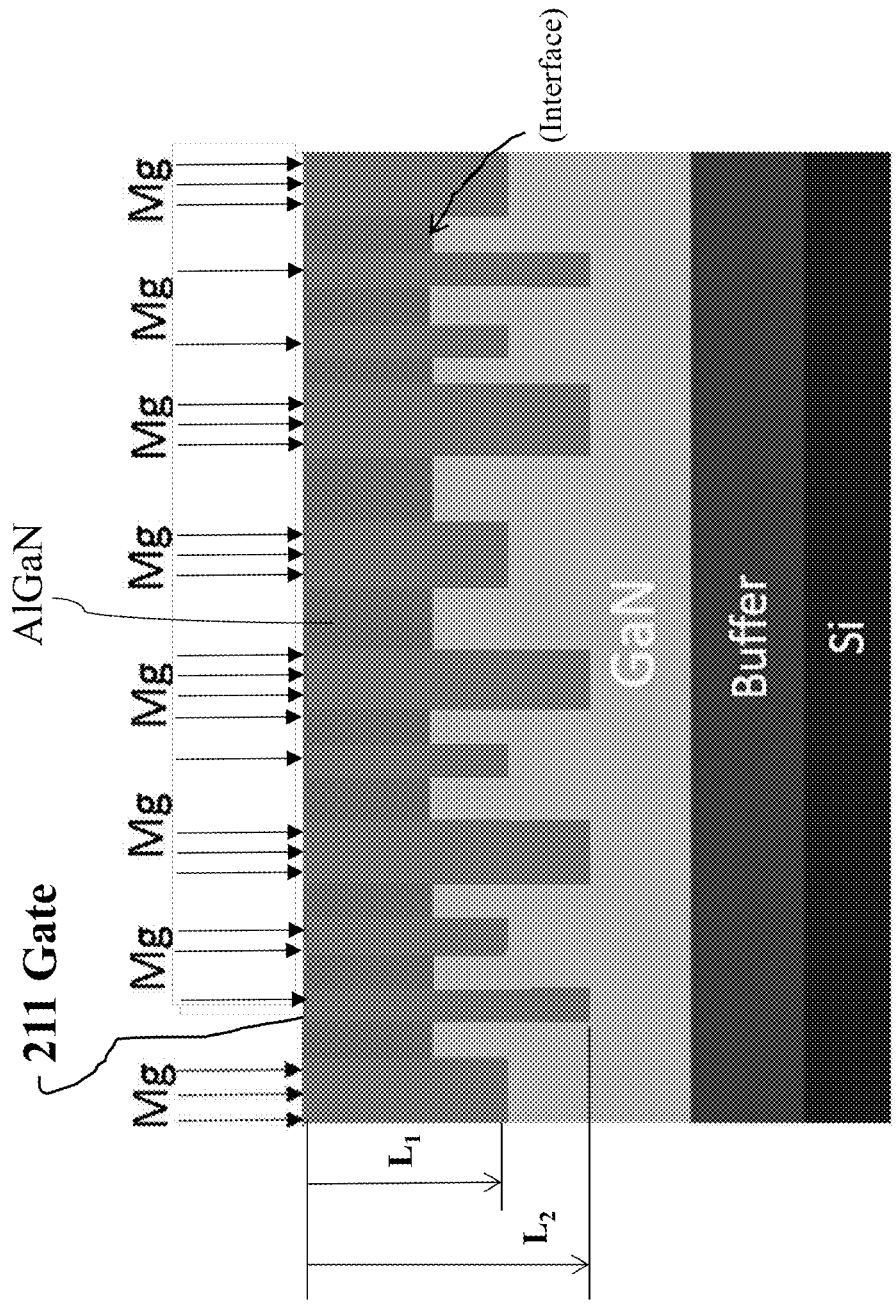
FIG. 2C is a schematic illustrating another cross section of the transistor device of FIG. 1A, underneath the gate region, showing that the selected Mg implanted selected locations that can include varied vertical lengths along a vertical direction from C location to D location (see FIG. 1A), according to some embodiments of the present disclosure.

FIG. 2C is a schematic illustrating another cross section of the gate of the transistor device of FIG. 1A, underneath the gate region, showing that the selected Mg implanted selected locations can include varied vertical lengths along a vertical direction from C location to D location (see FIG. 1A), according to some embodiments of the present disclosure. Each selected location 213 of FIG. 2A doped with Mg ions in the sub-region $R_{sub}$ of FIG. 2A has a profile, such that the profile includes a vertical profile length $L_1$, $L_2$ and a profile width $W_1$, $W_2$ of FIG. 2B. Wherein an aspect can be that each profile of the selected location includes one or a combination of, a constant profile width ($W_1=W_2$) of FIG. 2B, a variable profile width ($W_1 \neq W_2$) of FIG. 2B, a constant vertical profile length ($L_1=L_2$), or a variable vertical profile length ($L_1 \neq L_2$).

Wherein an aspect can be that the profiles form a pattern, such that profile widths of the profiles increase along a direction from a first width end A of FIG. 1A to a second width end B of FIG. 1A of the field effect transistor, resulting in a higher linearity than profiles having a constant profile width in the direction from the first width end to the second width end of the field effect transistor. It is possible an aspect can be that each profile is equally spaced along a width of the field effect transistor, or wherein each profile is not equally spaced and is varied along a width of the field effect transistor.

Figure 2D:
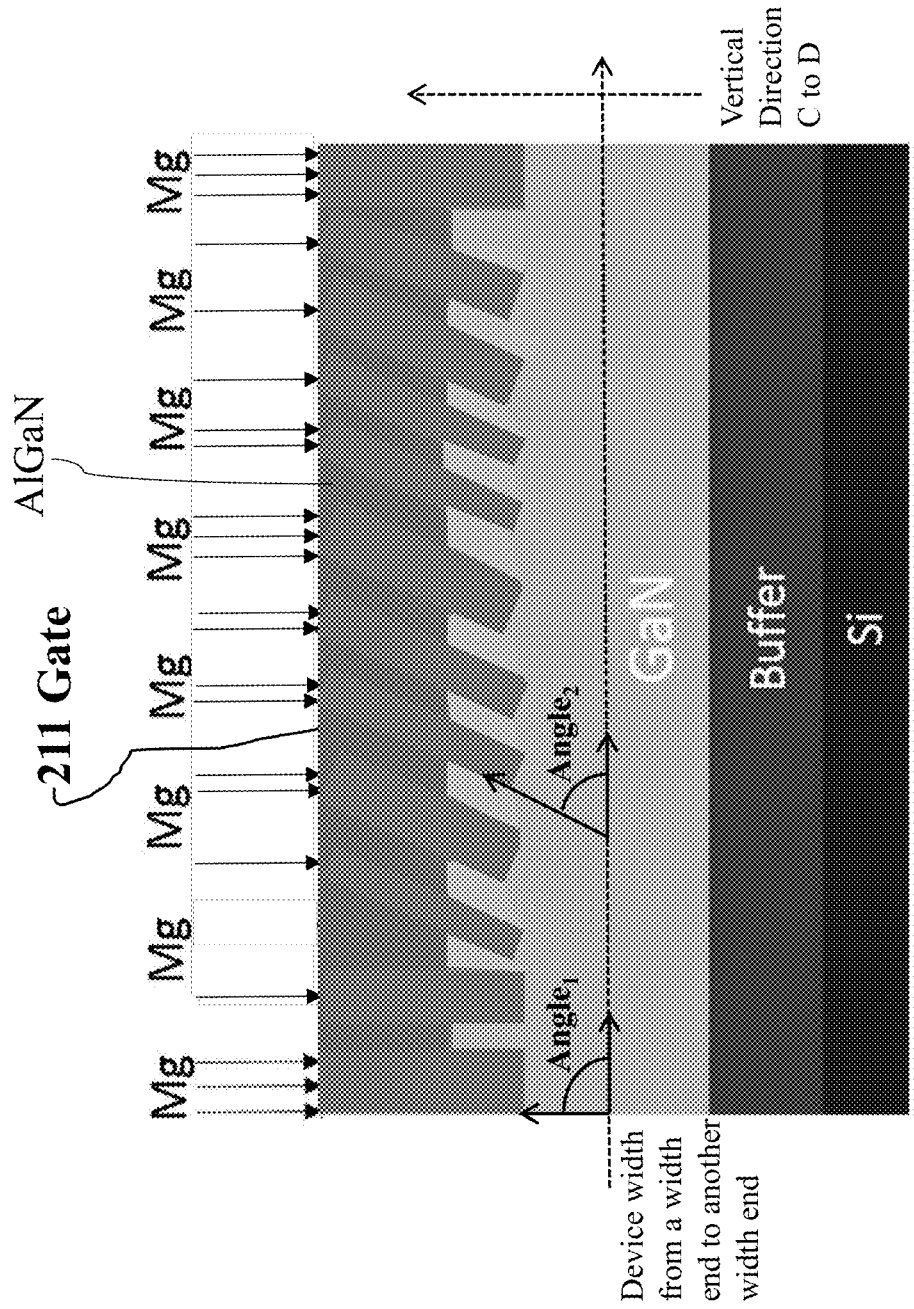
FIG. 2D is a schematic illustrating another cross section of the transistor device of FIG. 1A, underneath the gate region, showing that the selected Mg implanted selected locations that can be varied angles ranging from 90 degrees to about 80 degrees along a width direction from A location to B location (see FIG. 1A), according to some embodiments of the present disclosure.

FIG. 2D is a schematic illustrating another cross section of the transistor device of FIG. 1A, underneath the gate region, showing that the selected Mg implanted selected locations may have varied angles $A_1$, $A_2$ ranging from 90 degrees to about 80 degrees along a width direction from A location to B location (see FIG. 1A), according to some embodiments of the present disclosure.

Figure 3:
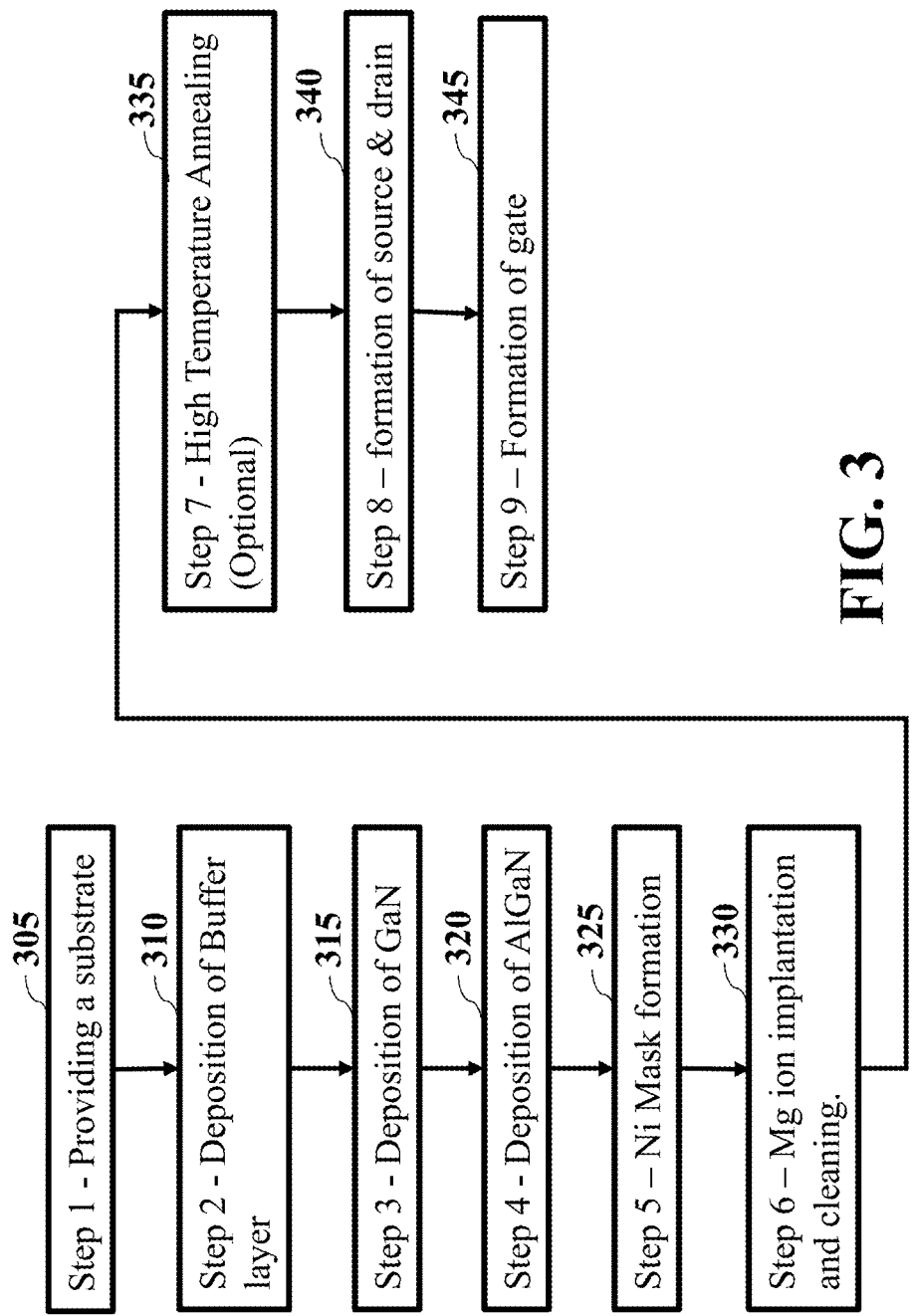
FIG. 3 is a block diagram illustrating a fabrication process of the transistor device, according to some embodiments of the present disclosure.

FIG. 3 is a block diagram illustrating a fabrication process of the transistor device, according to some embodiments of the present disclosure.

Step 305 shows the fabrication of the field transistor device that starts with growing the epi-structure. And the process starts with Si/Sapphire/SiC/GaN wafers. And the size of the wafers could be 2/4/6/12 inches.

Step 310 shows that if the wafer is not a GaN wafer, then a buffer layer is grown to tackle the lattice mismatch between the wafer material and the III-N semiconductor.

Then, Step 315 shows GaN semiconductor grown on the buffer layer. This layer thickness could be in the range of 450 nm to several micro-meters. Ideally, the layer thickness is a thicker layer of GaN, as the thicker layer helps to reduce a defect density in the III-N layers which, in turn, helps to obtain optimum device performance.

Then, Step 320 shows an III-N layer grown on top of GaN layer. But the III-N layer band gap needs to be higher than the GaN layer. Typically, a thickness of the III-N layer can be 5 nm to 30 nm. The buffer layer, the GaN layer and the III-N layer can be grown by any growth method using one or a combination of metal organic chemical vapor deposition (MOCVD), Molecular beam epitaxy (MBE) or remote plasma chemical vapor deposition (RPCVD), pulsed laser deposition (PLD), Sputtering and so on.

Step 325 shows the Ni hard mask formation step. E-beam lithography needed to form the Ni hard mask. After the E-beam lithography 50 nm thick Ni metal is deposited using E-beam evaporation method. And then lift-off is performed to create the Fin patterns.

Step 330 shows the Mg implantation step. Mg implantation is needed to convert GaN and AlGaN to p-type.

Step 335 shows the annealing step. Annealing is performed to activate Mg ions and generate holes.

Step 340 shows the formation of source and drain terminals. Photolithography is performed and Ti-20 nm/Al-100 nm/Ni-25 nm/Au-50 nm metals are deposited and lift-off is performed to form the metal contacts at the source and drain region. Then the contacts are annealed in $N_2$ at high temperature to form the ohmic contact.

Step 345 shows the formation of gate terminal. Photolithography is performed and Ni-20 nm/Au-80 nm metals are deposited and lift-off is performed to form the metal contacts at the gate region.

Features

An embodiment of the present disclosure includes a field effect transistor, including a source, a gate and a drain. A semiconductor region is under the source, the gate and the drain. Such that the semiconductor region includes a gallium nitride (GaN) layer and a three nitride (III-N) layer. Wherein GaN layer includes a band gap and the III-N layer includes a band gap, such that the III-N layer band gap is higher than the GaN layer band gap. A sub-region of the semiconductor region underneath the gate is doped with Mg ions at selective locations in the sub-region. Wherein the following aspects below are contemplated as configuring a modified embodiment of the above embodiment.

An aspect can include wherein the semiconductor region includes a base layer, a buffer layer over the base layer, and wherein the GaN layer is over the buffer layer. Another aspect can be that the III-N layer is an $Al_xIn_yGa_{1-x-y}N$, such that a value of x and y is between 0 and 1 ($0 \leq x \leq 1$), ($0 \leq y \leq 1$). Also, an aspect can be that the III-N layer has a higher spontaneous polarization charge than a spontaneous polarization charge of the GaN layer.

Contemplated is that an aspect can be a vertical thickness of the GaN layer is greater than a vertical thickness of the III-N layer. An aspect may be that a vertical thickness of the GaN layer is 10× times thicker than a vertical thickness of the III-N layer, or the vertical thickness of the GaN layer is 1000% percent thicker than the vertical thickness of the III-N layer. Another aspect may be that a gap distance between the source and the gate, and a gap distance between the gate and the drain, is one of symmetrical or non-symmetrical.

Another aspect can be that each selected location doped with Mg ions in the sub-region has a profile, such that the profile includes a vertical profile length and a profile width. An aspect can be that each profile of the selected location includes one or a combination of, a constant profile width, a variable profile width, a constant vertical profile length or a variable vertical profile length. Such that an aspect can be that the profiles form a pattern, such that profile widths of the profiles increase along a direction from a first width end to a second width end of the field effect transistor, resulting in a higher linearity than profiles having a constant profile width in the direction from the first width end to the second width end of the field effect transistor. It is possible an aspect can be that each profile is equally spaced along a width of the field effect transistor, or wherein each profile is not equally spaced and is varied along a width of the field effect transistor.

It is possible that an aspect can include the selected locations doped with Mg ions in the sub-region have profiles, such that the profiles are arranged at an angle within a range from about 90 degrees to 80 degrees. Another aspect can be that at an interface of the GaN layer and III-N layer there is an accumulation of two-dimensional gas (2-DEG). An aspect may be that the accumulation of the 2-DEG is depleted by the III-N layer, resulting an enhancement-mode (E-mode) operation for the field effect transistor. Another aspect may be that upon completion of the doping of the Mg ions in the selected locations in the sub-region, the sub-region is then annealed in a nitrogen gas environment. Further, an aspect can be that the III-N layer is an aluminum gallium nitrate (AlGaN), and wherein the selected locations doped with Mg ions in the sub-region converts the AlGaN layer to p-AlGaN, and converts the GaN layer to p-GaN, which results in generating holes in the Mg ion implanted selected locations of the sub-region.

Contemplated is that an aspect may be that each selected location doped with Mg ions in the sub-region has a depth extending from a top edge of the III-N layer across an interface of a bottom edge of the III-N layer into a top edge of the GaN layer.

An aspect may that the wherein the GaN layer and III-N layer are grown using one or a combination of metal organic chemical vapor deposition (MOCVD), Molecular beam epitaxy (MBE) or remote plasma chemical vapor deposition (RPCVD), and wherein the selected locations doped with Mg ions in the sub-region are formed by Mg ion plantation.

Definitions

According to aspects of the present disclosure, and based on experimentation, the following definitions have been established, and certainly are not a complete definition of each phrase or term. Wherein the provided definitions are merely provided as an example, based upon learnings from experimentation, wherein other interpretations, definitions, and other aspects may pertain. However, for at least a mere basic preview of the phrase or term presented, such definitions have been provided, but by "no means" can the definitions presented below can be applied as prior art, since this is knowledge gained only from experimentation.

Two layers in direct contact: Two layers that are in direct contact can be understood to be an arrangement where two contacting layers have no other intervening layer(s) present. That is, a direct physical contact between the two layers.

Two-dimensional (2D) semiconductor layer: A two-dimensional (2D) semiconductor layer refers to a semiconductor layer comprising a 2D material layer. Such materials have interesting properties in terms of anisotropic mobility and therefore allow for future scaling of transistor performance. For example, in some embodiments, a 2D material layer may have a dimension in one direction that is smaller than dimensions in other orthogonal directions, such that at least one physical property in the one direction may be different compared to the physical property in the other orthogonal directions. For example, physical properties that may be direction-dependent include band gap, electrical and/or thermal conductivities, density of states, carrier mobility's, etc. For example, when a 2D material layer is formed as a sheet in a plane formed by x and y directions and has a dimension in an orthogonal z direction that is sufficiently smaller compared to dimensions in the x and y directions, the 2D material layer may have a band gap that is different, e.g., greater, than a band gap in x and/or y directions. In addition, in some embodiments, 2D material layer may be a material having a layered structure, where atoms of the 2D material layer may have one type of bonding in x and y directions while having a different type of bonding in the z direction. For example, the atoms of the 2D material layer may be covalently bonded in x and y directions while being weakly bound, e.g., by Van der Waals forces, in the z direction.

Gallium nitride (GaN): GaN is a binary III/V direct bandgap semiconductor used in light-emitting diodes. The compound is a very hard material that has a Wurtzite crystal structure. Its wide band gap of 3.4 eV affords it special properties for applications in optoelectronic, high-power and high-frequency devices. For example, GaN is the substrate which makes violet (405 nm) laser diodes possible, without use of nonlinear optical frequency-doubling. Its sensitivity to ionizing radiation is low (like other group III nitrides), making it a suitable material for solar cell arrays for satellites. Space applications could also benefit as devices have shown stability in radiation environments. Because GaN transistors can operate at much higher temperatures and work at much higher voltages than gallium arsenide (GaAs) transistors, they make ideal power amplifiers at microwave frequencies. In addition, GaN offers promising characteristics for THz devices.

The very high breakdown voltages, high electron mobility and saturation velocity of GaN has also made it an ideal candidate for high-power and high-temperature microwave applications, as evidenced by its high Johnson's figure of merit. Potential markets for high-power/high-frequency devices based on GaN include microwave radio-frequency power amplifiers (such as those used in high-speed wireless data transmission) and high-voltage switching devices for power grids. A potential mass-market application for GaN-based RF transistors is as the microwave source for microwave ovens, replacing the magnetrons currently used. The large band gap means that the performance of GaN transistors is maintained up to higher temperatures (~400° C.) than silicon transistors (~150° C.) because it lessens the effects of thermal generation of charge carriers that are inherent to any semiconductor. An enhancement-mode GaN transistors that are only n-channel transistors were designed to replace power MOSFETs in applications where switching speed or power conversion efficiency is critical. These transistors, also called eGaN FETs, can be built by growing a thin layer of GaN on top of a standard silicon wafer. Which allows the eGaN FETs to maintain costs similar to silicon power MOSFETs but with the superior electrical performance of GaN. GaN transistors can be depletion mode devices, i.e. on/resistive when a gate-source voltage is zero.

Aluminum gallium nitride (AlGaN): AlGaN is a semiconductor material, and is any alloy of aluminum nitride and gallium nitride. The bandgap of AlxGa1-xN can be tailored from 3.4 eV (xAl=0) to 6.2 eV (xAl=1). Also, AlGaN can be used to manufacture light-emitting diodes operating in blue to ultraviolet region, where wavelengths down to 250 nm (far UV) were achieved. AlGaN can be used in blue semiconductor lasers, used in detectors of ultraviolet radiation, and in AlGaN/GaN High-electron-mobility transistors. AlGaN can be used together with gallium nitride or aluminum nitride, forming heterojunctions. AlGaN layers can be grown on Gallium nitride, on sapphire or Si, and sometimes with additional GaN layers.

Digital IC applications: A simplest circuit configuration can be achieved by using direct-coupled FET logic (DCFL) which features integration of D-mode and E-mode HEMTs.

RFIC design: RFIC is an abbreviation of radio-frequency integrated circuit. Applications for RFICs include radar and communications, although the term RFIC might be applied to any electrical integrated circuit operating in a frequency range suitable for wireless transmission. RFIC has a potential cost benefit of shifting as much of the wireless transceiver as possible to a single technology, which in turn would allow for a system on a chip solution as opposed to the more common system-on-package.

MMIC design: Monolithic microwave integrated circuit, or MMIC is a type of integrated circuit (IC) device that operates at microwave frequencies (300 MHz to 300 GHz). These devices perform functions such as microwave mixing, power amplification, low-noise amplification, and high-frequency switching. Inputs and outputs on MMIC devices are frequently matched to a characteristic impedance of 50 ohms. This makes them easier to use, as cascading of MMICs does not then require an external matching network. Additionally, most microwave test equipment is designed to operate in a 50-ohm environment. MMICs are dimensionally small (from around 1 mm$^2$ to 10 mm$^2$) and can be mass-produced, which has allowed for high-frequency devices such as cellular phones. MMICs has two fundamental advantages over silicon (Si), the traditional material for IC realization, device (transistor) speed and a semi-insulating substrate. Both factors help with the design of high-frequency circuit functions. However, the speed of Si-based technologies has gradually increased as transistor feature sizes have reduced, and MMICs can also be fabricated in Si technology. The primary advantage of Si technology is its lower fabrication cost compared with GaAs. Silicon wafer diameters are larger (typically 8" to 15" compared with 4" to 8" for GaAs) and the wafer costs are lower, contributing to a less expensive IC. Gallium nitride (GaN) is an option for MMICs. Because GaN transistors can operate at much higher temperatures and work at much higher voltages than GaAs transistors, they make ideal power amplifiers at microwave frequencies.

High electron mobility transistors (HEMTs): Also known as heterostructure FET (HFET) or modulation-doped FET (MODFET), is a field-effect transistor incorporating a junction between two materials with different band gaps (i.e. a heterojunction) as the channel instead of a doped region (as is generally the case for a MOSFET). A material combination can be GaAs with AlGaAs, though there is wide variation, dependent on the application of the device. Devices incorporating more indium generally show better high-frequency performance, gallium nitride HEMTs has high-power performance. Like other FETs, HEMTs are used in integrated circuits as digital on-off switches. FETs can also be used as amplifiers for large amounts of current using a small voltage as a control signal. Both of these uses are made possible by the FET's unique current-voltage characteristics. HEMT transistors are able to operate at higher frequencies than ordinary transistors, up to millimeter wave frequencies, and are used in high-frequency products such as cell phones, satellite television receivers, voltage converters, and radar equipment. They are used in satellite receivers, in low power amplifiers and in the defense industry. Some advantages of HEMTs can be that they have high gain, this makes them useful as amplifiers; high switching speeds, which are achieved because the main charge carriers in MODFETs are majority carriers, and minority carriers are not significantly involved; and extremely low noise values because the current variation in these devices is low compared to other FETs. HEMTs are heterojunctions. This means that the semiconductors used have dissimilar band gaps. For instance, silicon has a band gap of 1.1 electron volts (eV), while germanium has a band gap of 0.67 eV. When a heterojunction is formed, the conduction band and valence band throughout the material must bend in order to form a continuous level.

The HEMTs' exceptional carrier mobility and switching speed come from the following conditions: The wide band element is doped with donor atoms; thus, it has excess electrons in its conduction band. These electrons will diffuse to the adjacent narrow band material's conduction band due to the availability of states with lower energy. The movement of electrons will cause a change in potential and thus an electric field between the materials. The electric field will push electrons back to the wide band element's conduction band. The diffusion process continues until electron diffusion and electron drift balance each other, creating a junction at equilibrium similar to a p-n junction. Note that the undoped narrow band gap material now has excess majority charge carriers. The fact that the charge carriers are majority carriers yields high switching speeds, and the fact that the low band gap semiconductor is undoped means that there are no donor atoms to cause scattering and thus yields high mobility.

An important aspect of HEMTs is that the band discontinuities across the conduction and valence bands can be modified separately. This allows the type of carriers in and out of the device to be controlled. As HEMTs require electrons to be the main carriers, a graded doping can be applied in one of the materials, thus making the conduction band discontinuity smaller and keeping the valence band discontinuity the same. This diffusion of carriers leads to the accumulation of electrons along the boundary of the two regions inside the narrow band gap material. The accumulation of electrons leads to a very high current in these devices. The accumulated electrons are also known as 2DEG or two-dimensional electron gas. The term "modulation doping" refers to the fact that the dopants are spatially in a different region from the current carrying electrons.

To allow conduction, semiconductors are doped with impurities which donate either mobile electrons or holes. However, these electrons are slowed down through collisions with the impurities (dopants) used to generate them in the first place. HEMTs avoid this through the use of high mobility electrons generated using the heterojunction of a highly doped wide-bandgap n-type donor-supply layer (AlGaAs in our example) and a non-doped narrow-bandgap channel layer with no dopant impurities (GaAs in this case). The electrons generated in the thin n-type AlGaAs layer drop completely into the GaAs layer to form a depleted AlGaAs layer, because the heterojunction created by different band-gap materials forms a quantum well (a steep canyon) in the conduction band on the GaAs side where the electrons can move quickly without colliding with any impurities because the GaAs layer is undoped, and from which they cannot escape. The effect of this is to create a very thin layer of highly mobile conducting electrons with very high concentration, giving the channel very low resistivity (or to put it another way, "high electron mobility"). Further, HEMTs based on AlGaN/GaN heterostructures present excellent candidates for high-power, high-voltage and high-temperature applications.

Depletion-mode (D-mode) HEMTs: In field effect transistors (FETs), depletion mode and enhancement mode are two major transistor types, corresponding to whether the transistor is in an ON state or an OFF state at zero gate-source voltage. Enhancement-mode MOSFETs (metal-oxide-semiconductor FETs) are the common switching elements in most integrated circuits. These devices are off at zero gate-source voltage. NMOS can be turned on by pulling the gate voltage higher than the source voltage, PMOS can be turned on by pulling the gate voltage lower than the source voltage. In most circuits, this means pulling an enhancement-mode MOSFET's gate voltage towards its drain voltage turns it ON. In a depletion-mode MOSFET, the device is normally ON at zero gate-source voltage. Such devices are used as load "resistors" in logic circuits (in depletion-load NMOS logic, for example). For N-type depletion-load devices, the threshold voltage might be about −3 V, so it could be turned off by pulling the gate 3 V negative (the drain, by comparison, is more positive than the source in NMOS). In PMOS, the polarities are reversed. The mode can be determined by the sign of the threshold voltage (gate voltage relative to source voltage at the point where an inversion layer just forms in the channel): for an N-type FET, enhancement-mode devices have positive thresholds, and depletion-mode devices have negative thresholds; for a P-type FET, enhancement-mode negative, depletion-mode positive.

Largescale IC design: Very large-scale integration (VLSI) is a process of creating an integrated circuit (IC) by combining millions of MOS transistors onto a single chip. The structured VLSI design is a modular methodology used for saving microchip area by minimizing the interconnect fabrics area. This is obtained by repetitive arrangement of rectangular macro blocks which can be interconnected using wiring by abutment. An example is partitioning the layout of an adder into a row of equal bit slices cells. In complex designs this structuring may be achieved by hierarchical nesting.

Two-dimensional electron gas (2-DEG): 2DEG is a scientific model in solid-state physics. It is an electron gas that is free to move in two dimensions, but tightly confined in the third. This tight confinement leads to quantized energy levels for motion in the third direction, which can then be ignored for most problems. Thus the electrons appear to be a 2D sheet embedded in a 3D world. The analogous construct of holes is called a two-dimensional hole gas (2DHG), and such systems have many useful and interesting properties.

Most 2DEG are found in transistor-like structures made from semiconductors. The most commonly encountered 2DEG is the layer of electrons found in MOSFETs (metal-oxide-semiconductor field-effect transistors). When the transistor is in inversion mode, the electrons underneath the gate oxide are confined to the semiconductor-oxide interface, and thus occupy well defined energy levels. For thin-enough potential wells and temperatures not too high, only the lowest level is occupied (see the figure caption), and so the motion of the electrons perpendicular to the interface can be ignored. However, the electron is free to move parallel to the interface, and so is quasi-two-dimensional.

For engineering, 2DEGs are high-electron-mobility-transistors (HEMTs) and rectangular quantum wells. HEMTs are field-effect transistors that utilize the heterojunction between two semiconducting materials to confine electrons to a triangular quantum well. Electrons confined to the heterojunction of HEMTs exhibit higher mobilities than those in MOSFETs, since the former device utilizes an intentionally undoped channel thereby mitigating the deleterious effect of ionized impurity scattering. Two closely spaced heterojunction interfaces may be used to confine electrons to a rectangular quantum well. Careful choice of the materials and alloy compositions allow control of the carrier densities within the 2DEG.

Electrons may also be confined to the surface of a material. For example, free electrons will float on the surface of liquid helium, and are free to move along the surface, but stick to the helium; some of the earliest work in 2DEGs was done using this system. Besides liquid helium, there are also solid insulators (such as topological insulators) that support conductive surface electronic states.

Dangling bond: In chemistry, a dangling bond is an unsatisfied valence on an immobilized atom. An atom with a dangling bond is also referred to as an immobilized free radical or an immobilized radical, a reference to its structural and chemical similarity to a free radical. In order to gain enough electrons to fill their valence shells (see also octet rule), many atoms will form covalent bonds with other atoms. In the simplest case, that of a single bond, two atoms each contribute one unpaired electron, and the resulting pair of electrons is shared between them. Atoms which possess too few bonding partners to satisfy their valences and which possess unpaired electrons are termed "free radicals"; so, often, are molecules containing such atoms. When a free radical exists in an immobilized environment (for example, a solid), it is referred to as an "immobilized free radical" or a "dangling bond".

Both free and immobilized radicals display very different chemical characteristics from atoms and molecules containing only complete bonds. Generally, they are extremely reactive. Immobilized free radicals, like their mobile counterparts, are highly unstable, but they gain some kinetic stability because of limited mobility and steric hindrance. While free radicals are usually short lived, immobilized free radicals often exhibit a longer lifetime because of this reduction in reactivity.

Ferroelectricity: is a characteristic of certain materials that have a spontaneous electric polarization that can be reversed by the application of an external electric field. All ferroelectrics are pyroelectric, with the additional property that their natural electrical polarization is reversible. The term is used in analogy to ferromagnetism, in which a material exhibits a permanent magnetic moment.

Polarization: When most materials are polarized, the polarization induced, P, is almost exactly proportional to the applied external electric field E; so the polarization is a linear function. This is called dielectric polarization. Some materials, known as paraelectric materials, show a more enhanced nonlinear polarization. The electric permittivity, corresponding to the slope of the polarization curve, is not constant as in dielectrics but is a function of the external electric field. In addition to being nonlinear, ferroelectric materials demonstrate a spontaneous nonzero polarization even when the applied field E is zero. The distinguishing feature of ferroelectrics is that the spontaneous polarization can be reversed by a suitably strong applied electric field in the opposite direction; the polarization is therefore dependent not only on the current electric field but also on its history, yielding a hysteresis loop. They are called ferroelectrics by analogy to ferromagnetic materials, which have spontaneous magnetization and exhibit similar hysteresis loops. Typically, materials demonstrate ferroelectricity only below a certain phase transition temperature, called the Curie temperature (TC) and are paraelectric above this temperature: the spontaneous polarization vanishes, and the ferroelectric crystal transforms into the paraelectric state. Many ferroelectrics lose their piezoelectric properties above Tc completely, because their paraelectric phase has a centrosymmetric crystal structure. The nonlinear nature of ferroelectric materials can be used to make capacitors with tunable capacitance. Typically, a ferroelectric capacitor simply consists of a pair of electrodes sandwiching a layer of ferroelectric material. The permittivity of ferroelectrics is not only tunable but commonly also very high in absolute value, especially when close to the phase transition temperature. Because of this, ferroelectric capacitors are small in physical size compared to dielectric (non-tunable) capacitors of similar capacitance.

Spontaneous Polarization: The spontaneous polarization of ferroelectric materials implies a hysteresis effect which can be used as a memory function, and ferroelectric capacitors are indeed used to make ferroelectric RANI for computers and RFID cards. In these applications thin films of ferroelectric materials are typically used, as this allows the field required to switch the polarization to be achieved with a moderate voltage. However, when using thin films, a great deal of attention needs to be paid to the interfaces, electrodes and sample quality for devices to work reliably.

Metal Organic Chemical Vapor Deposition (MOCVD): MOCVD is also known as metalorganic vapor-phase epitaxy (MOVPE), or organometallic vapor-phase epitaxy (OMVPE), is a chemical vapor deposition method used to produce single- or polycrystalline thin films. MOCVD is a process for growing crystalline layers to create complex semiconductor multilayer structures. In contrast to molecular-beam epitaxy (MBE), the growth of crystals is by chemical reaction and not physical deposition. This takes place not in vacuum, but from the gas phase at moderate pressures (10 to 760 Torr).

Molecular beam epitaxy (MBE): MBE is an epitaxy method for thin-film deposition of single crystals. The MBE process is used in the manufacture of semiconductor devices, including transistors, and is used to fabricate diodes.

Remote Plasma Chemical Vapor Deposition (RPCVD): RPCVD is a low growth temperature technology developed by BluGlass Ltd. for use in high-brightness LED applications. The unique growth conditions of RPCVD are demonstrated to produce Activated As-Grown (AAG) buried p-GaN for achieving GaN-based tunnel junctions (TJ) for use in current spreading and potential use in cascade LED and LD applications.

Sputtering: Sputter deposition is a physical vapor deposition (PVD) method of thin film deposition by sputtering. This involves ejecting material from a "target" that is a source onto a "substrate" such as a silicon wafer. Resputtering is re-emission of the deposited material during the deposition process by ion or atom bombardment. Sputtered atoms ejected from the target have a wide energy distribution, typically up to tens of eV (100,000 K). The sputtered ions (typically only a small fraction of the ejected particles are ionized—on the order of 1 percent) can ballistically fly from the target in straight lines and impact energetically on the substrates or vacuum chamber (causing resputtering).

Pulsed laser deposition (PLD): PLD is a physical vapor deposition (PVD) technique where a high-power pulsed laser beam is focused inside a vacuum chamber to strike a target of the material that is to be deposited. This material is vaporized from the target (in a plasma plume) which deposits it as a thin film on a substrate (such as a silicon wafer facing the target). This process can occur in ultra-high vacuum or in the presence of a background gas, such as oxygen which is commonly used when depositing oxides to fully oxygenate the deposited films. While the basic setup is simple relative to many other deposition techniques, the physical phenomena of laser-target interaction and film growth are quite complex. When the laser pulse is absorbed by the target, energy is first converted to electronic excitation and then into thermal, chemical and mechanical energy resulting in evaporation, ablation, plasma formation and even exfoliation. The ejected species expand into the surrounding vacuum in the form of a plume containing many energetic species including atoms, molecules, electrons, ions, clusters, particulates and molten globules, before depositing on the typically hot substrate.

EMBODIMENTS

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Further, embodiments of the present disclosure and the functional operations described in this specification can be implemented in digital electronic circuitry, in tangibly-embodied computer software or firmware, in computer hardware, including the structures disclosed in this specification and their structural equivalents, or in combinations of one or more of them. Further some embodiments of the present disclosure can be implemented as one or more computer programs, i.e., one or more modules of computer program instructions encoded on a tangible non-transitory program carrier for execution by, or to control the operation of, data processing apparatus. Further still, program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

According to embodiments of the present disclosure the term "data processing apparatus" can encompass all kinds of apparatus, devices, and machines for processing data, including by way of example a programmable processor, a computer, or multiple processors or computers.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network. Computers suitable for the execution of a computer program include, by way of example, can be based on general or special purpose microprocessors or both, or any other kind of central processing unit. Generally, a central processing unit will receive instructions and data from a read only memory or a random-access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A field effect transistor, comprising:
    a source;
    a gate;
    a drain;
    a semiconductor region under the source, the gate and the drain, such that the semiconductor region includes a gallium nitride (GaN) layer and a three nitride (III-N) layer; and
    a sub-region of the semiconductor region underneath the gate doped with Mg ions at selective locations in the sub-region, wherein each of the selective locations doped with Mg ions in the sub-region has a profile, such that the profile includes a vertical profile length and a profile width, and wherein the profiles form a pattern, such that profile widths of the profiles increase along a direction from a first width end to a second width end of the field effect transistor.

2. The field effect transistor of claim 1, wherein the semiconductor region includes
    a base layer,
    a buffer layer over the base layer, wherein the GaN layer is over the buffer layer.

3. The field effect transistor of claim 1, wherein the III-N layer is an AlxInyGa1-x-yN, such that a value of x and y is between 0 and 1 (0≤x≤1), (0≤y≤1).

4. The field effect transistor of claim 1, wherein the III-N layer has a higher spontaneous polarization charge than a spontaneous polarization charge of the GaN layer.

5. The field effect transistor of claim 1, wherein the vertical thickness of the GaN layer is greater than a vertical thickness of the III-N layer.

6. The field effect transistor of claim 1, wherein the vertical thickness of the GaN layer is 10 times thicker than a vertical thickness of the III-N layer, or the vertical thickness of the GaN layer is 1000% percent thicker than the vertical thickness of the III-N layer.

7. The field effect transistor of claim 1, wherein a gap distance between the source and the gate, and a gap distance between the gate and the drain, is one of symmetrical or non-symmetrical.

8. The field effect transistor of claim 1, wherein a gap distance between the gate and the drain correlates to a breakdown voltage of the field effect transistor.

9. The field effect transistor of claim 1, wherein each profile of the selective locations has one or a combination of, a constant profile width, a variable profile width, a constant vertical profile length or a variable vertical profile length.

10. The field effect transistor of claim 1, wherein each profile is equally spaced along a width of the field effect transistor, or wherein each profile is not equally spaced from each other and is varied along a width of the field effect transistor.

11. The field effect transistor of claim 1, wherein the selective locations doped with Mg ions in the sub-region have profiles, such that the profiles are arranged at an angle within a range from 90 degrees to 80 degrees with respect to a plane of the III-N layer.

12. The field effect transistor of claim 1, wherein at an interface of the GaN layer and III-N layer there is an accumulation of two-dimensional gas (2-DEG), wherein the selective locations doped with Mg ions in the sub-region comprise Mg ion implantation regions such that the accumulation of the 2-DEG is depleted by the Mg ion implantation regions, resulting in an enhancement-mode (E-mode) operation for the field effect transistor.

13. The field effect transistor of claim 1, wherein upon completion of the doping of the Mg ions in the selective locations in the sub-region, the sub-region is then annealed in a nitrogen gas environment.

14. The field effect transistor of claim 1, wherein the III-N layer is an aluminum gallium nitride (AlGaN), and wherein the selective locations doped with Mg ions in the sub-region convert the AlGaN layer to p-AlGaN, and convert the GaN layer to p-GaN, which results in generating holes in the Mg ion implanted selective locations of the sub-region.

15. The field effect transistor of claim 1, wherein each of the selective locations doped with Mg ions in the sub-region has a depth extending from a top edge of the III-N layer across an interface of a bottom edge of the III-N layer into a top edge of the GaN layer.

16. A transistor, comprising:
    a source;
    a gate;
    a drain;
    a semiconductor region under the source, the gate and the drain, such that the semiconductor region includes a gallium nitride (GaN) layer and a three nitride (III-N) layer, wherein GaN layer includes a band gap, and the III-N layer includes a band gap, such that the III-N layer band gap is higher than the GaN layer band gap, wherein the GaN layer and the III-N layer are undoped; and
    a sub-region of the semiconductor region underneath the gate is doped with Mg ions at selective locations in the sub-region, wherein each of the selective locations doped with Mg ions in the sub-region has a profile, such that the profile includes a vertical profile length and a profile width, and wherein the profiles form a pattern, such that profile widths of the profiles increase along a direction from a first width end to a second width end of the field effect transistor.

17. The transistor of claim 16, wherein the GaN layer and III-N layer are grown using one or a combination of metal organic chemical vapor deposition (MOCVD), Molecular beam epitaxy (MBE) or remote plasma chemical vapor deposition (RPCVD), and wherein the selective locations doped with Mg ions in the sub-region are formed by Mg ion implantation.

18. A transistor, comprising:
    a source;
    a gate;
    a drain;

a semiconductor region under the source, the gate and the drain, such that the semiconductor region includes a gallium nitride (GaN) layer and a three nitride (III-N) layer, wherein GaN layer includes a band gap, and the III-N layer includes a band gap, such that the III-N layer band gap is higher than the GaN layer band gap, wherein the III-N layer has a higher spontaneous polarization charge than a spontaneous polarization charge of the GaN layer; and a sub-region of the semiconductor region underneath the gate is doped with Mg ions at selective locations in the sub-region, wherein each of the selective locations doped with Mg ions in the sub-region has a profile, such that the profile includes a vertical profile length and a profile width, and wherein the profiles form a pattern, such that profile widths of the profiles increase along a direction from a first width end to a second width end of the field effect transistor.

* * * * *